US010566257B2

(12) United States Patent
Kurahashi

(10) Patent No.: US 10,566,257 B2
(45) Date of Patent: Feb. 18, 2020

(54) METHOD FOR MANUFACTURING WIRING BOARD

(71) Applicant: IBIDEN CO., LTD., Ogaki (JP)

(72) Inventor: Naoki Kurahashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 200 days.

(21) Appl. No.: 15/633,968

(22) Filed: Jun. 27, 2017

(65) Prior Publication Data

US 2017/0372980 A1 Dec. 28, 2017

(30) Foreign Application Priority Data

Jun. 27, 2016 (JP) ................................ 2016-126955

(51) Int. Cl.
*H01K 3/10* (2006.01)
*H01L 23/13* (2006.01)
(Continued)

(52) U.S. Cl.
CPC ............ *H01L 23/13* (2013.01); *H01L 21/486* (2013.01); *H01L 21/4857* (2013.01); *H01L 21/6835* (2013.01); *H01L 23/49838* (2013.01); *H05K 3/429* (2013.01); *H05K 3/4602* (2013.01); *H05K 3/4697* (2013.01); *H01L 23/49822* (2013.01); *H01L 23/49827* (2013.01); *H01L 23/5389* (2013.01); *H01L 24/16* (2013.01); *H01L 24/48* (2013.01); *H01L 25/105* (2013.01);
(Continued)

(58) Field of Classification Search
CPC .................. H01L 23/13; H01L 21/6835; H01L 23/49822; H01L 23/49827; H01L 23/49838; H01L 21/4857; H01L 21/486; H01L 2224/16237; H01L 23/5389; H01L 2221/68345; H01L 2221/68359; H01L 2225/1035; H01L 2924/15153; H05K 3/429; H05K 3/4697; H05K 3/4602; H05K 2201/09127; H05K 3/0097; H05K 3/4682; H05K 2203/107
USPC .................................. 29/830, 846, 850, 852
See application file for complete search history.

(56) References Cited

U.S. PATENT DOCUMENTS

| | | | |
|---|---|---|---|
| 8,017,442 B2* | 9/2011 | Hsu ...................... | H01L 21/4857 438/113 |
| 8,519,270 B2* | 8/2013 | Chang .................. | H05K 3/4697 174/250 |
| 2017/0127517 A1* | 5/2017 | Ishihara ................ | H05K 1/056 |

FOREIGN PATENT DOCUMENTS

JP 2015-060912 A 3/2015

* cited by examiner

*Primary Examiner* — Donghai D Nguyen
(74) *Attorney, Agent, or Firm* — Oblon, McClelland, Maier & Neustadt, L.L.P.

(57) ABSTRACT

A method for manufacturing a wiring board includes forming on a first support plate a first laminated wiring portion including conductor and insulating layers such that the first portion has a first surface on first support plate side and a second surface, separating the first portion from the first plate, forming a conductor layer exposed on the first surface and including pads, laminating the first portion on a second support plate such that the second surface of the first portion faces second support plate side, forming on the first surface of the first portion a second laminated wiring portion including conductor and insulating layers such that the second portion has a third surface on second support plate side and a fourth surface, forming cavity in the second portion on the second plate such that the cavity exposes the pads, and separating the first and second portions from the second plate.

20 Claims, 13 Drawing Sheets

(51) Int. Cl.
*H01L 21/48* (2006.01)
*H01L 21/683* (2006.01)
*H01L 23/498* (2006.01)
*H05K 3/42* (2006.01)
*H05K 3/46* (2006.01)
H01L 23/538 (2006.01)
H01L 23/00 (2006.01)
H01L 25/10 (2006.01)
H05K 3/00 (2006.01)

(52) U.S. Cl.
CPC ............... *H01L 2221/68345* (2013.01); *H01L 2221/68359* (2013.01); *H01L 2224/16227* (2013.01); *H01L 2224/48091* (2013.01); *H01L 2224/48106* (2013.01); *H01L 2224/48227* (2013.01); *H01L 2225/1035* (2013.01); *H01L 2225/1058* (2013.01); *H01L 2924/15153* (2013.01); *H05K 3/0097* (2013.01); *H05K 3/4682* (2013.01); *H05K 2203/107* (2013.01)

METHOD FOR MANUFACTURING WIRING BOARD

CROSS-REFERENCE TO RELATED APPLICATIONS

The present application is based upon and claims the benefit of priority to Japanese Patent Application No. 2016-126955, filed Jun. 27, 2016, the entire contents of which are incorporated herein by reference.

BACKGROUND OF THE INVENTION

Field of the Invention

The present invention relates to a method for manufacturing a wiring board having a cavity portion.

Description of Background Art

For example, Japanese Patent Laid-Open Publication No. 2015-60912 describes a method for manufacturing a wiring board in which a first laminated wiring portion and a second laminated wiring portion are prepared, and the second laminated wiring portion is laminated and bonded onto the first laminated wiring portion. The entire contents of this publication are incorporated herein by reference.

SUMMARY OF THE INVENTION

According to one aspect of the present invention, a method for manufacturing a wiring board includes forming on a first support plate a first laminated wiring portion including conductor layers and insulating layers such that the first laminated wiring portion has a first surface on a first support plate side and a second surface on the opposite side with respect to the first surface, separating the first laminated wiring portion from the first support plate, forming a conductor layer exposed on the first surface of the first laminated wiring portion and including pads, laminating the first laminated wiring portion on a second support plate such that the second surface of the first laminated wiring portion faces a second support plate side, forming on the first surface of the first laminated wiring portion a second laminated wiring portion including conductor layers and insulating layers such that the second laminated wiring portion has a third surface on a second support plate side and a fourth surface on the opposite side with respect to the third surface, forming a cavity portion in the second laminated wiring portion on the second support plate such that the cavity portion exposes the pads, and separating the first laminated wiring portion and the second laminated wiring portion from the second support plate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1A:
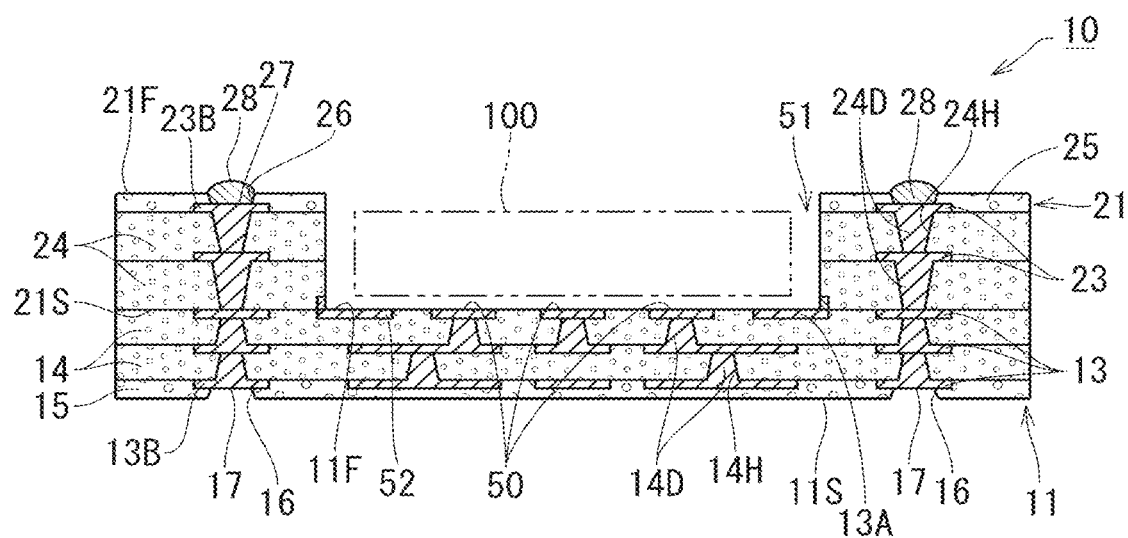
FIG. 1A is a cross-sectional side view of a wiring board.

Embodiments will now be described with reference to the accompanying drawings, wherein like reference numerals designate corresponding or identical elements throughout the various drawings.

Figure 1B:
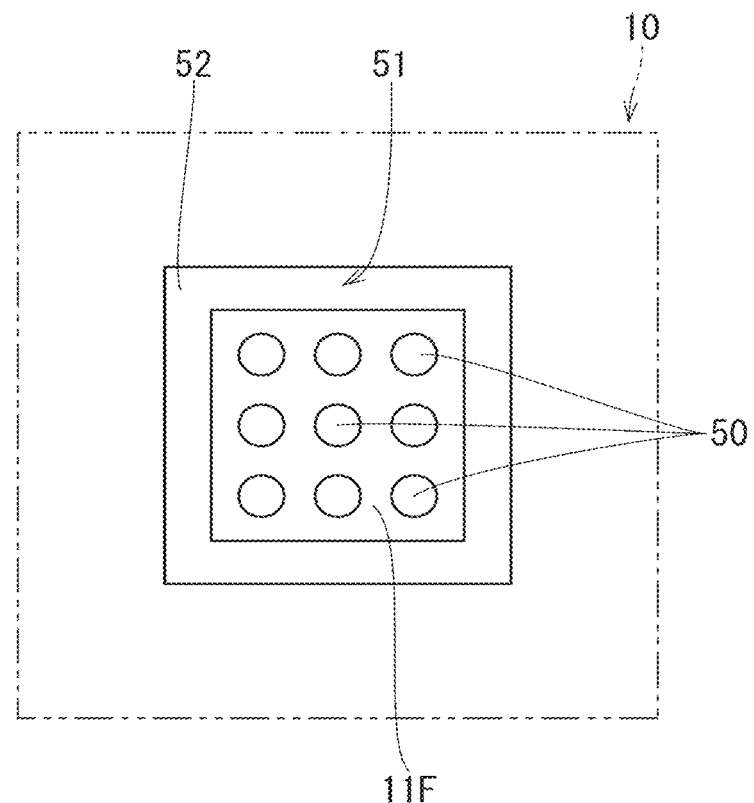
FIG. 1B is a plan view of the wiring board.

In the following, an embodiment is described with reference to FIG. 1-13. As illustrated in FIGS. 1A and 1B, a wiring board 10 of the present embodiment has a cavity portion 51 that opens on a front side. Specifically, the wiring board 10 is formed by laminating a second laminated wiring portion 21 on a first laminated wiring portion 11 from the front side, the cavity portion 51 being formed penetrating the second laminated wiring portion 21. An electronic component 100 mounted on the first laminated wiring portion 11 is accommodated in the cavity portion 51.

The first laminated wiring portion 11 has a structure in which multiple conductor layers 13 and multiple interlayer insulating layers 14 are alternately laminated. Adjacent conductor layers (13, 13) are connected to each other by multiple first via conductors (14D) formed in the interlayer insulating layers 14. The first via conductors (14D) are formed by filling via holes (14H) formed in the interlayer insulating layers 14 with plating. Further, the first via conductors (14D) each have a tapered shape that is gradually reduced in diameter from a second surface (11S) side toward a first surface (11F) side, the second surface (11S) being a back side surface of the first laminated wiring portion 11 and the first surface (11F) being a front side surface of the first laminated wiring portion 11. The interlayer insulating layers 14 are each formed from, for example, a prepreg (a resin sheet of a B-stage formed by impregnating a core material with a resin) or an insulating film (a film formed of a thermosetting resin that does not contain a core material but contains an inorganic filler) for a build-up substrate.

A solder resist layer 15 is laminated on an outermost conductor layer (13B), which is formed on a most back side (side closest to the second surface (11S)) among the multiple conductor layers 13 of the first laminated wiring portion 11. Openings 16 are formed in the solder resist layer 15. Then, of the outermost conductor layer (13B), portions exposed from the solder resist layer 15 by the openings 16 respectively form pads 17.

In the present embodiment, the interlayer insulating layers 14 and the solder resist layer 15 correspond to "insulating layers" of the present invention in the first laminated wiring portion 11. In the example of the present embodiment, the first laminated wiring portion 11 has three "conductor layers" according to the present invention and three "insulating layers" according to the present invention. However, the present invention is not limited to this. It is sufficient as long as the first laminated wiring portion 11 has multiple conductor layers and multiple insulating layers.

A first conductor layer (13A) of a predetermined pattern formed on a most front side among the multiple conductor layers 13 of the first laminated wiring portion 11 is exposed on the first surface (11F). Resin of an interlayer insulating layer 14 adjacent to the first conductor layer (13A) from a back side enters into portions of the first surface (11F) where the first conductor layer (13A) is not formed so that the first surface (11F) is flat. Further, an annular pattern 52 as a part of the first conductor layer (13A) is formed on the first surface (11F). Pads 50 for mounting an electronic component 100 are formed as a part of the first conductor layer (13A) in a portion of the first surface (11F) surrounded by the annular pattern 52.

The second laminated wiring portion 21 has a structure in which multiple interlayer insulating layers 24 and multiple conductor layers 23 are alternately laminated. Second via conductors (24D) are formed in the interlayer insulating layers 24, and adjacent conductor layers (23, 23) are connected to each other by the second via conductors (24D). The second via conductors (24D) are formed by filling via holes (24H) formed in the interlayer insulating layer 24 with plating. The second via conductors (24D) each have a tapered shape that is gradually reduced in diameter from a fourth surface (21F) side toward a third surface (21S) side, the fourth surface (21F) being a front side surface of the second laminated wiring portion 21 and the third surface (21S) being a back side surface of the second laminated wiring portion 21.

Among the multiple interlayer insulating layers 24 of the second laminated wiring portion 21, an interlayer insulating layer 24 formed on a most back side forms the third surface (21S) of the second laminated wiring portion 21. Then, a conductor layer 23 adjacent to this interlayer insulating layer 24 from a front side and the first conductor layer (13A) of the first laminated wiring portion 11 adjacent to this interlayer insulating layer 24 from a back side are connected to each other by the second via conductors (24D). The interlayer insulating layers 24 of the second laminated wiring portion 21 are each formed from, for example, a prepreg or an insulating film for a build-up substrate.

A solder resist layer 25 is laminated on an outermost conductor layer (23B) formed on most front side among the conductor layers 23 of the second laminated wiring portion 21. Openings 26 are formed in the solder resist layer 25. Then, of the outermost conductor layer (23B), portions exposed from the solder resist layer 25 by the openings 26 respectively form pads 27. Solder bumps 28 are respectively formed on the pads 27 for connecting to an electronic component or a wiring board or the like (for example, a later-described wiring board 202 illustrated in FIG. 2) to be mounted on the second laminated wiring portion 21.

In the present embodiment, the interlayer insulating layers 24 and the solder resist layer 25 correspond to "insulating layers" of the present invention in the second laminated wiring portion 21. In the example of the present embodiment, the second laminated wiring portion 21 has two "conductor layers" according to the present invention and two "insulating layers" according to the present invention. However, the present invention is not limited to this. It is sufficient as long as the second laminated wiring portion 21 has one or more conductor layers and one or more insulating layers.

As illustrated in FIG. 1B, the above-described cavity portion 51 formed in the second laminated wiring portion 21 has a quadrangular shape in a plan view, and exposes a portion of the first surface (11F) of the first laminated wiring portion 11. Specifically, the above-described pads 50 and annular pattern 52 provided on the first surface (11F) are exposed. An outer shape of the annular pattern 52 is slightly larger than the cavity portion 51 when viewed from a thickness direction of the wiring board 10, and the second laminated wiring portion 21 is laminated on an outer peripheral part of the annular pattern 52.

In the example of the present embodiment, the annular pattern 52 is not connected to the multiple conductor layers 13 of the first laminated wiring portion 11 excluding the annular pattern 52 and is not connected to the conductor layers 23 of the second laminated wiring portion 21 (that is, the annular pattern 52 is electrically isolated). However, it is also possible that the annular pattern 52 is connected to the conductor layers. In the case of the structure of the present embodiment, it is also possible that the annular pattern 52 forms a ground layer to be grounded. Further, the annular pattern 52 may be used as noise filter or the like.

Figure 2:
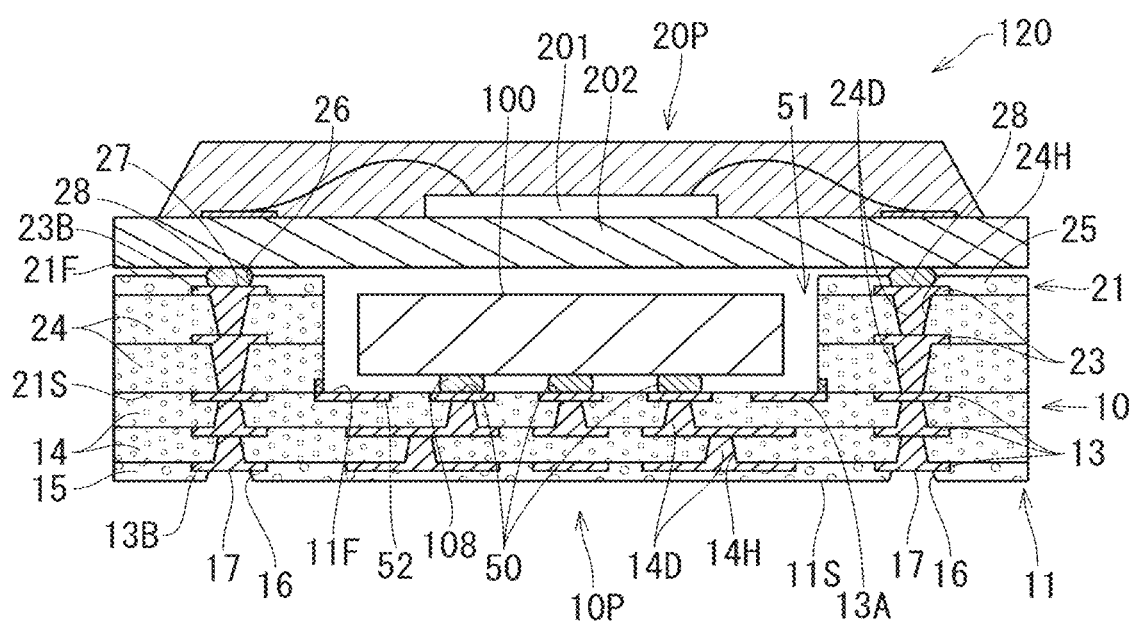
FIG. 2 is a cross-sectional side view of a PoP that includes the wiring board.

FIG. 2 illustrates an example in which the wiring board 202 is mounted on the wiring board 10. In the example illustrated in FIG. 2, the electronic component 100 is connected on the wiring board 10 by solder bumps 108 formed on the pads 50, and a first package substrate (10P) is formed. Then, a second package substrate (20P) formed by providing a memory 201 on the wiring board 202 is mounted on the first package substrate (10P), and a PoP 120 (Package on Package 120) is formed.

The wiring board 10 of the present embodiment is manufactured as follows.

Figure 3A:
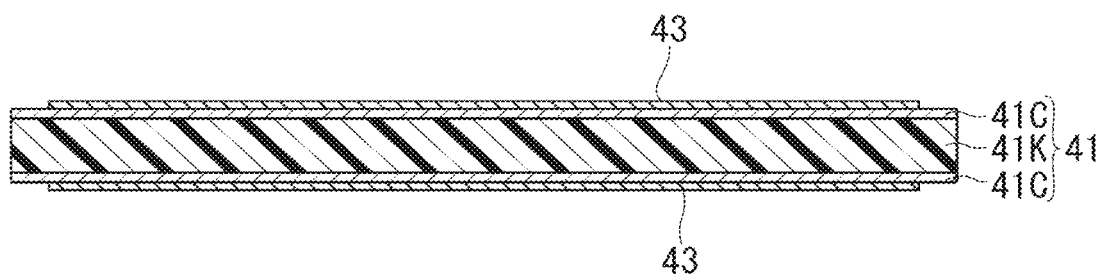
FIG. 3A-3C are cross-sectional side views illustrating manufacturing processes of the wiring board.
Figure 3B:
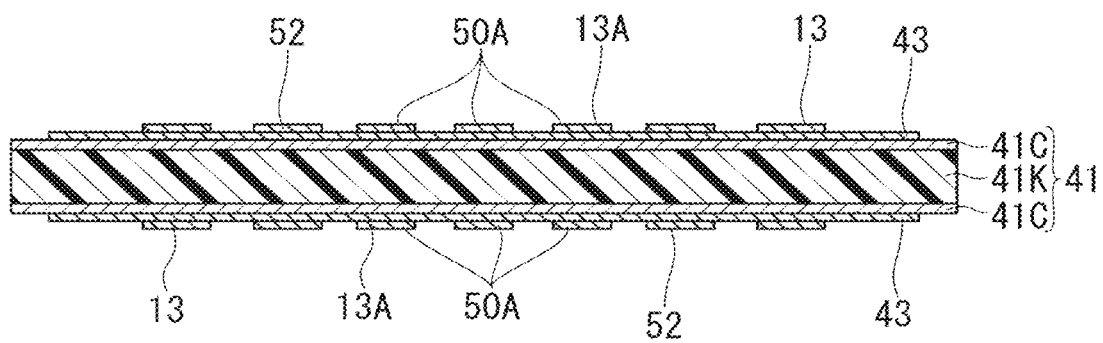

(1) As illustrated in FIG. 3A, a first support plate 41 formed by respectively laminating carriers (41C, 41C) on both sides of a base material (41K) is prepared. A copper foil 43 is laminated on each of the carriers (41C).

(2) A plating resist of a predetermined pattern is formed on the copper foil 43 on the first support plate 41. Then, by performing an electrolytic plating treatment, an electrolytic plating film is formed on a portion of the copper foil 43 exposed from the plating resist. Thereby, a conductor layer 13 (the first conductor layer (13A)) including the annular pattern 52 and pad formation parts (50A) formed on an inner side of the annular pattern 52 is formed on the copper foil 43. Next, the plating resist is removed (see FIG. 3B).

Figure 3C:
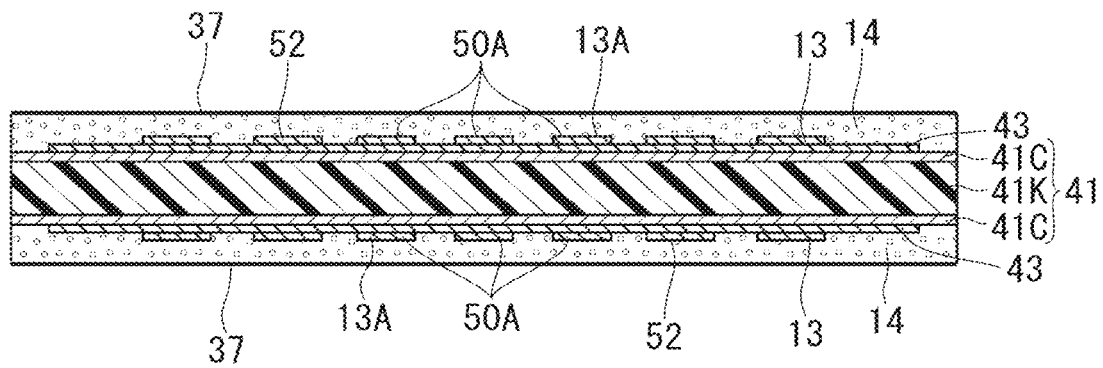

(3) As illustrated in FIG. 3C, on each of front and back sides of the first support plate 41, a prepreg as an interlayer insulating layer 14 and a copper foil 37 are laminated on the first conductor layer (13A), and thereafter, the resulting substrate is hot-pressed. In this case, portions of the copper foil 43 on the first support plate 41 exposed from the first conductor layer (13A) are covered by resin of the prepreg. As an interlayer insulating layer 14, instead of a prepreg, it is also possible to use an insulating film for a build-up substrate. In this case, an electroless plating film can be directly formed on the insulating film for a build-up substrate by an electroless plating treatment in a process (5) described below without laminating the copper foil 37.

Figure 4A:
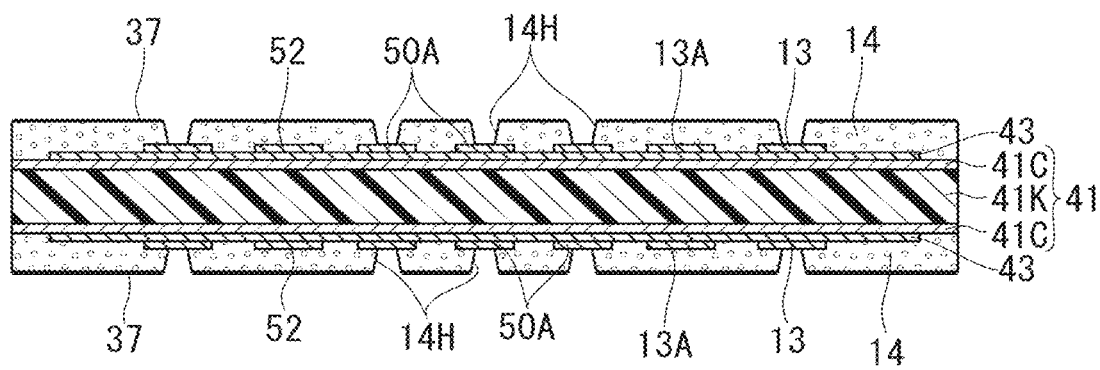
FIG. 4A-4C are cross-sectional side views illustrating manufacturing processes of the wiring board.

(4) As illustrated in FIG. 4A, on each of the front and back sides of the first support plate 41, laser is irradiated to the interlayer insulating layer 14, and the multiple via holes (14H) penetrating the interlayer insulating layer 14 are formed. The multiple via holes (14H) are formed on the first conductor layer (13A) and each have a tapered shape that is gradually reduced in diameter toward the first support plate 41 side.

(5) An electroless plating treatment is performed, and an electroless plating film (not illustrated in the drawings) is formed on the copper foil 37 laminated on each of the interlayer insulating layers 14 and on inner surfaces of the via holes (14H).

Figure 4B:
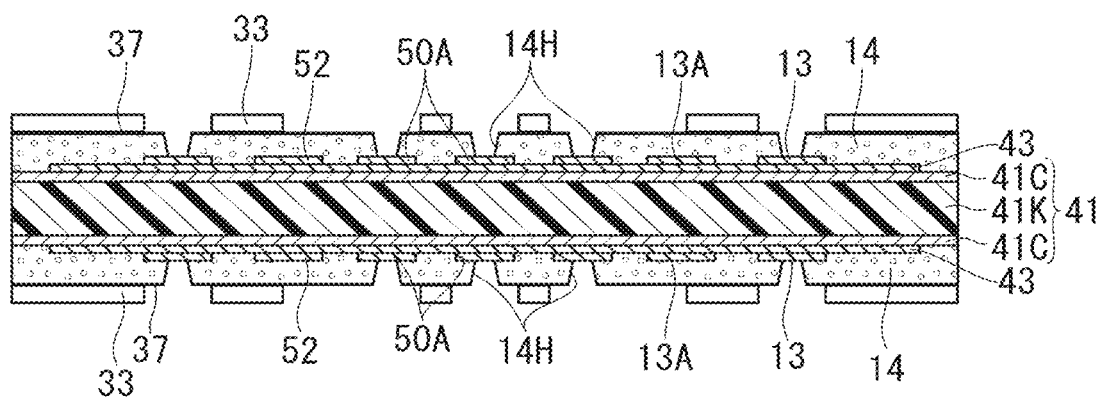

(6) As illustrated in FIG. 4B, a plating resist 33 of a predetermined pattern is formed on the electroless plating film on the copper foil 37 laminated on each of the interlayer insulating layers 14.

Figure 4C:
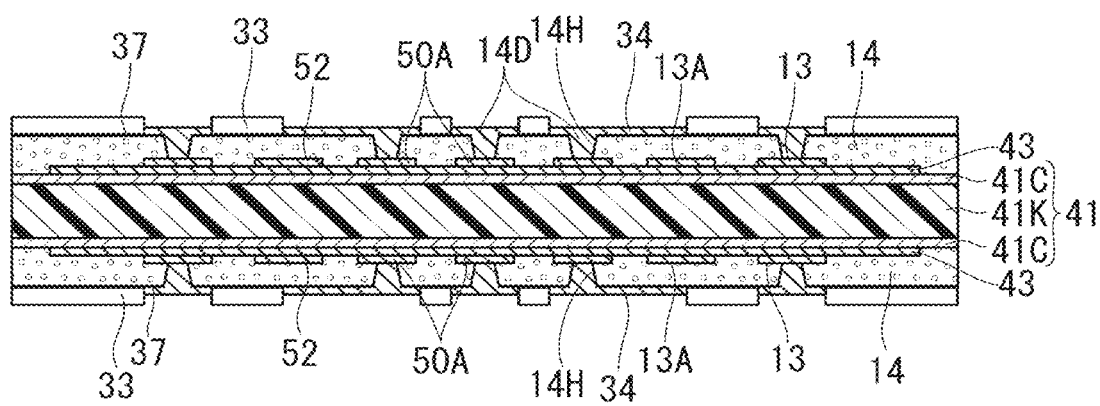

(7) An electrolytic plating treatment is performed. As illustrated in FIG. 4C, the via holes (14H) are filled with electrolytic plating and the first via conductors (14D) are formed. Further, an electrolytic plating film 34 is formed on portions of the electroless plating film on the copper foil 37 exposed from the plating resist 33.

Figure 5A:
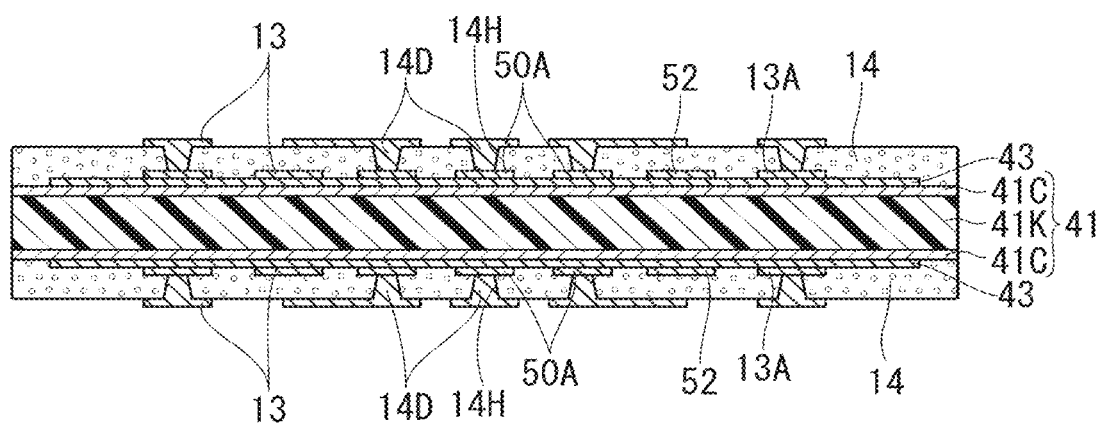
FIGS. 5A and 5B are cross-sectional side views illustrating manufacturing processes of the wiring board.

(8) The plating resist 33 is peeled off, and the electroless plating film and the copper foil 37 below the plating resist 33 are removed. Then, as illustrated in FIG. 5A, a conductor layer 13 is formed by the remaining electrolytic plating film 34, electroless plating film and copper foil 37 on the interlayer insulating layer 14.

Figure 5B:
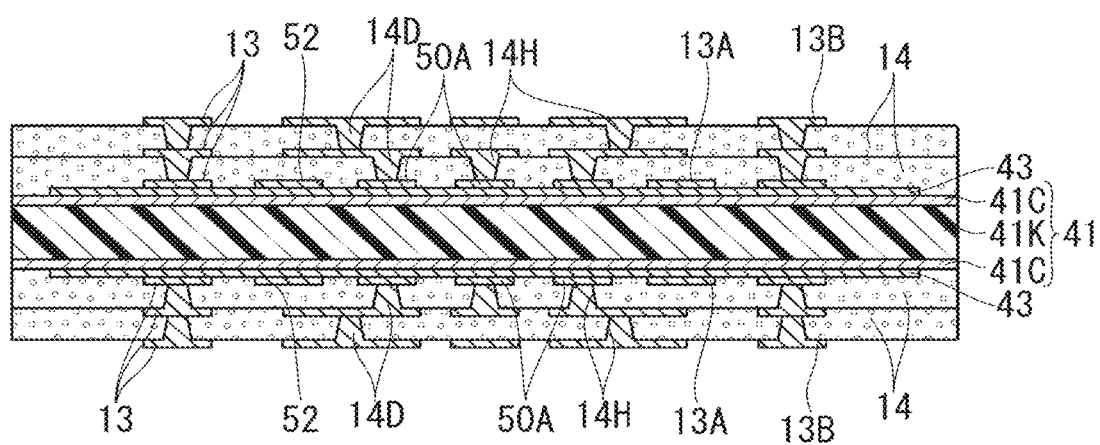

(9) By performing the same processes as the above-described processes (3)-(8), as illustrated in FIG. 5B, on each of the front and back sides of the first support plate 41, an interlayer insulating layer 14 and a conductor layer 13 are further laminated, and, in the laminated interlayer insulating layer 14, first via conductors (14D) are formed connecting the conductor layers (13, 13) sandwiching the interlayer insulating layer 14.

Figure 6A:
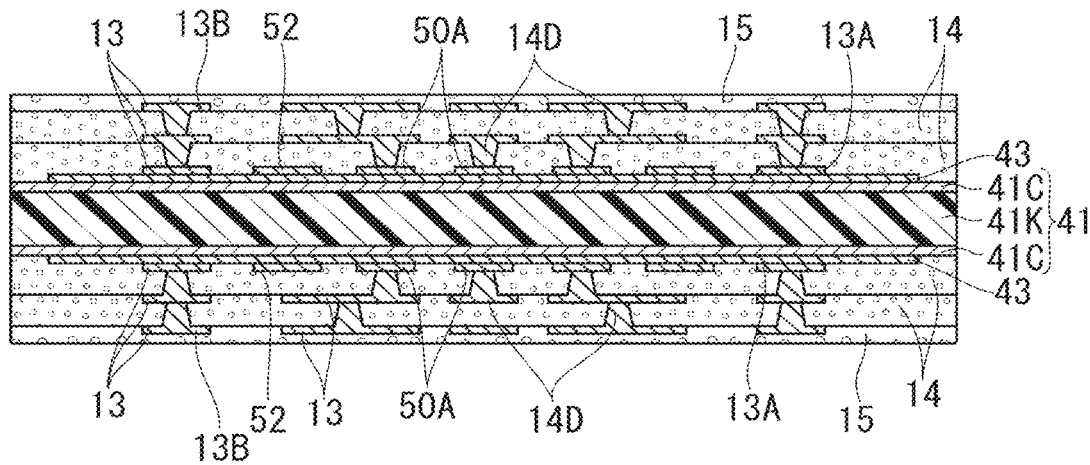
FIGS. 6A and 6B are cross-sectional side views illustrating manufacturing processes of the wiring board.
Figure 6B:
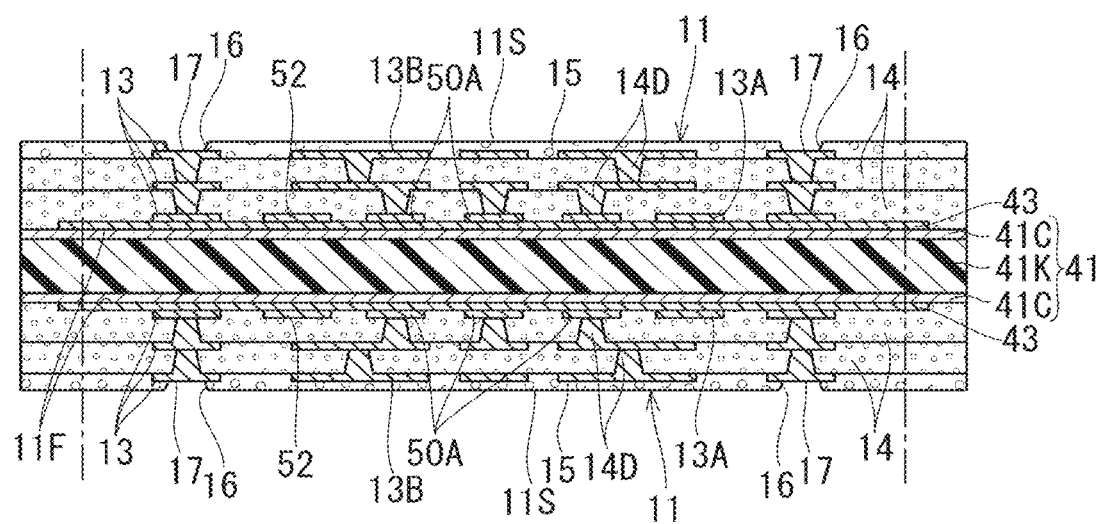

(10) As illustrated in FIG. 6A, a solder resist layer 15 is formed on each of the outermost conductor layers (13B, 13B), which are the conductor layers (13, 13) farthest from the first support plate 41. Next, as illustrated in FIG. 6B, the openings 16 are formed at predetermined places in the solder resist layer 15 by, for example, laser processing or photo-resist processing or the like. Then, of the outermost conductor layer (13B), portions exposed from the solder resist layer 15 by the openings 16 respectively form the pads 17.

(11) Outer edges of the copper foils 43, the conductor layers 13, the interlayer insulating layers 14 and the solder resist layers 15 laminated on the first support plate 41 are trimmed together with the first support plate 41 (a trimming line is indicated using a one-dotted chain line in FIG. 6B). As a result, on each of the front and back sides of the first support plate 41, a first laminated wiring portion 11 is formed on the copper foil 43. In this case, of each of the first laminated wiring portions 11, a surface facing the first support plate 41 side is the first surface (11F), and a surface on an opposite side of the first surface (11F) is the second surface (11S).

(12) The first laminated wiring portion 11 and the copper foil 43 are separated from the first support plate 41. Next, the copper foil 43 is removed from the first laminate wiring portion 11 using an etching solution, and the first conductor layer (13A) is exposed on the first surface (11F). As a result, the above-described annulus pattern 52 and pad formation parts (50A) are exposed on the first surface (11F), and the pads 50 are respectively formed by portions of the pad formation parts (50A) exposed on the first surface (11F) (see FIG. 7A).

(13) A second support plate 42 (see FIG. 7B) is prepared. The second support plate 42 has a structure in which a release film (42F) is laminated on both front and back sides of a base material (42K). The base material (42K) may be formed of, for example, a prepreg, or may be a stainless steel plate. The release film (42F) has moderate adhesion.

Figure 7A:
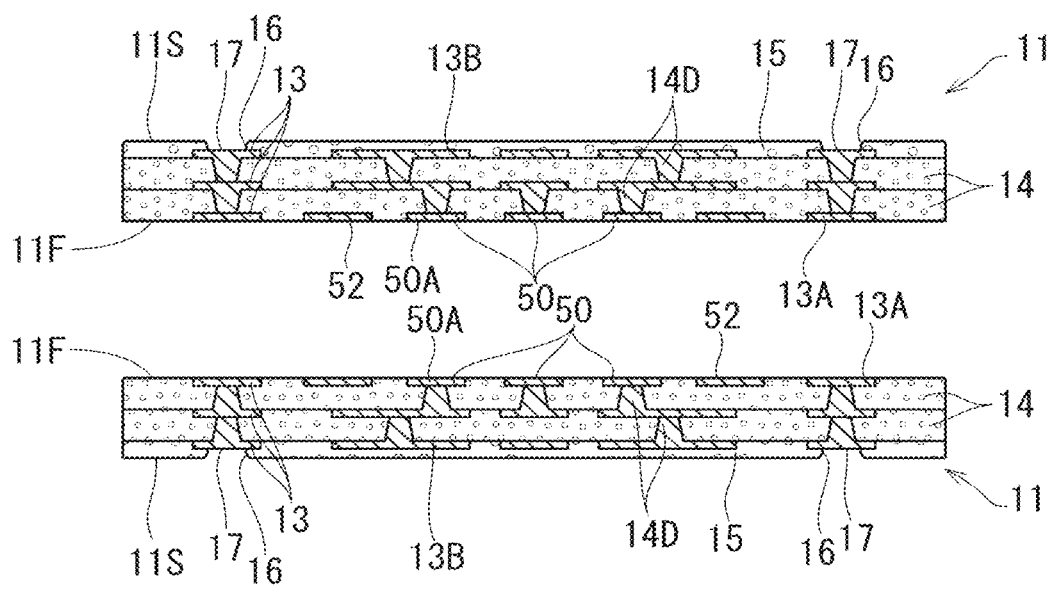
FIGS. 7A and 7B are cross-sectional side views illustrating manufacturing processes of the wiring board.
Figure 7B:
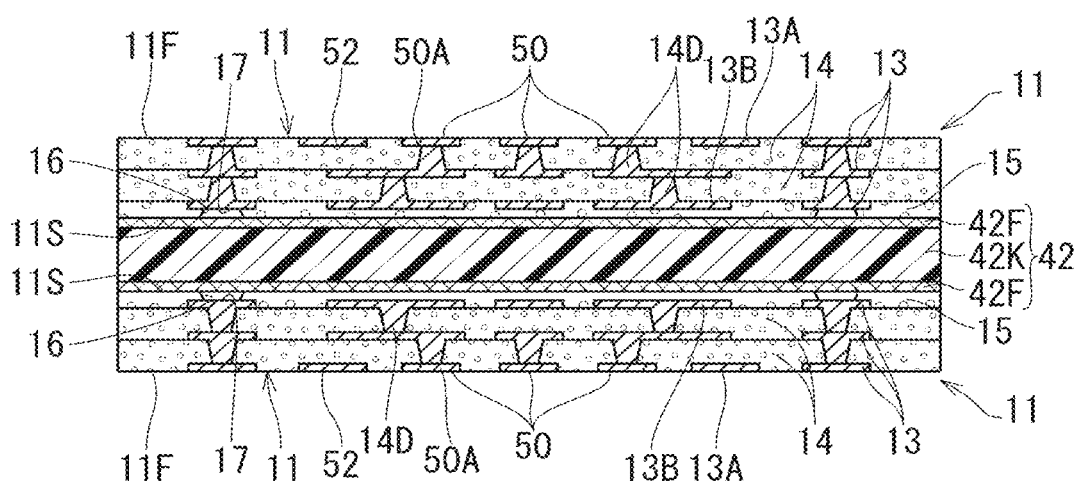

(14) As illustrated in FIG. 7B, the first laminated wiring portions (11, 11) are respectively laminated on both front and back sides of the second support plate 42 such that the second surface (11S) faces the second support plate 42 side.

Figure 8A:
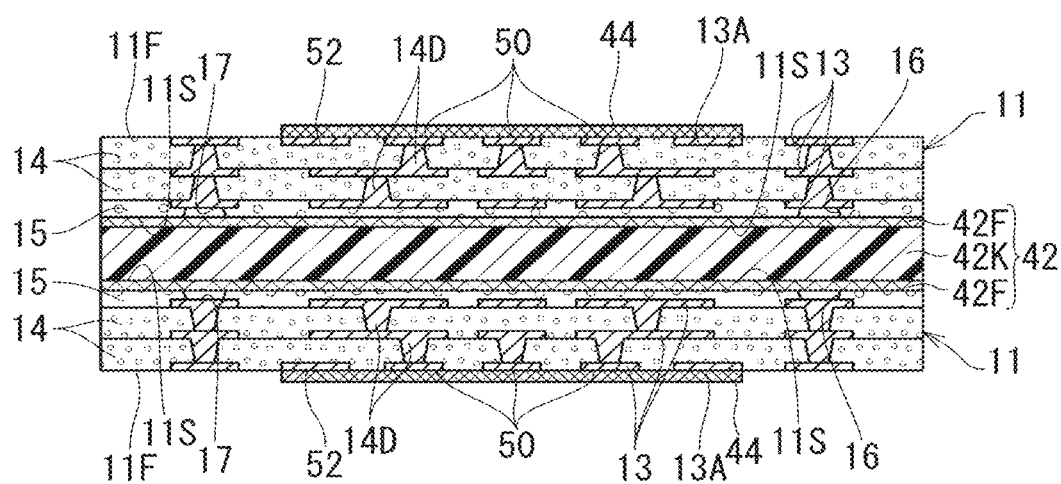
FIGS. 8A and 8B are cross-sectional side views illustrating manufacturing processes of the wiring board.

(15) As illustrated in FIG. 8A, a release film 44 (corresponding to a "release layer" of the present invention) is laid on the first surface (11F) of each laminated wiring portion 11 so as to cover an entire portion including the annular pattern 52 and a portion inside the annular pattern 52. In the present embodiment, the release film 44 is slightly larger than the outer shape of the annular pattern 52.

Figure 8B:
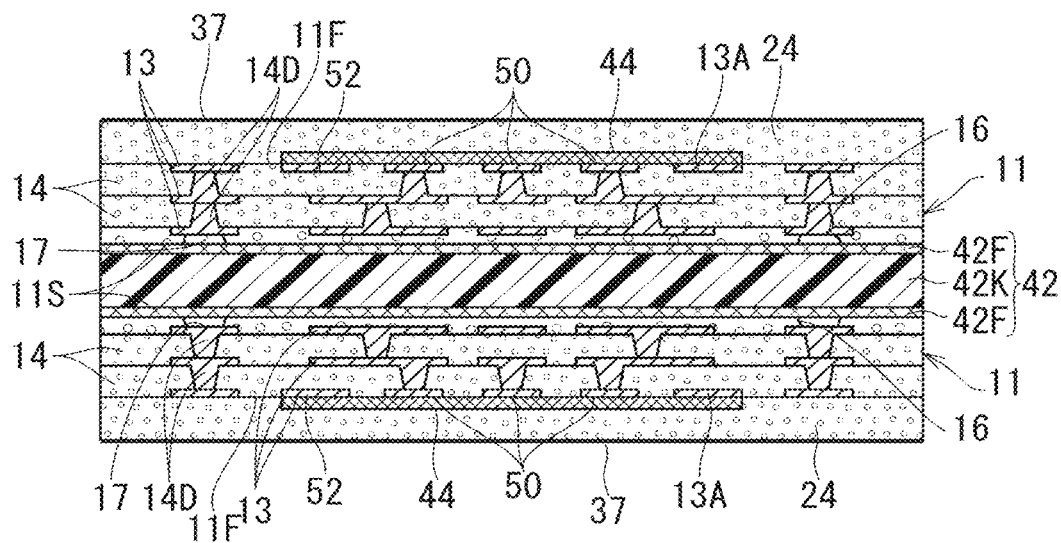

(16) As illustrated in FIG. 8B, on the first surface (11F) of each laminated wiring portion 11, a prepreg as an interlayer insulating layer 24 and a copper foil 37 are laminated from above the release film 44, and thereafter, the resulting substrate is hot-pressed. As an interlayer insulating layer 24, instead of a prepreg, it is also possible to use an insulating film for a build-up substrate. In this case, an electroless plating film can be directly formed on the insulating film for a build-up substrate by an electroless plating treatment in a process (18) described below without laminating the copper foil 37.

Figure 9A:
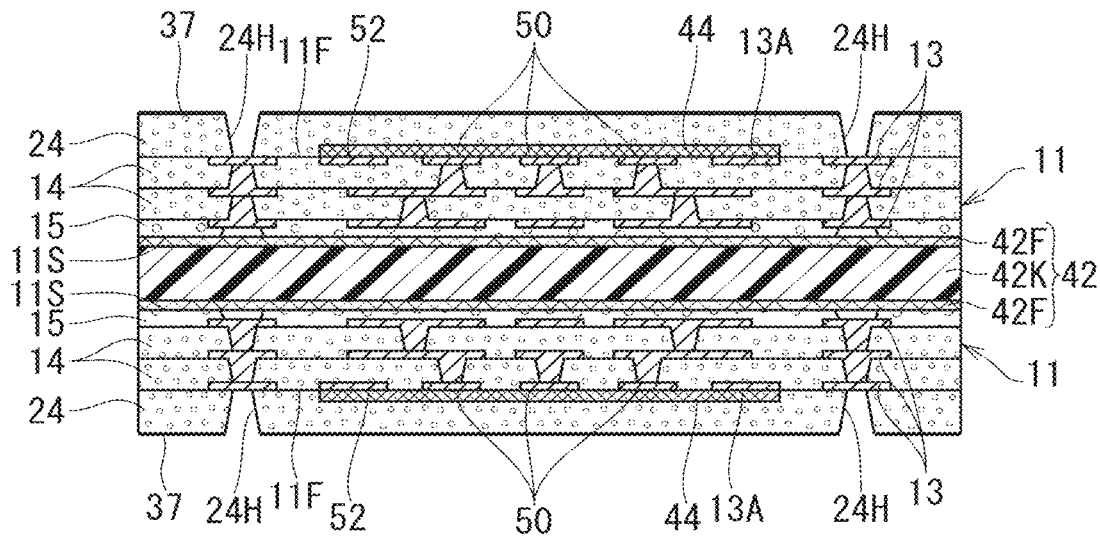
FIGS. 9A and 9B are cross-sectional side views illustrating manufacturing processes of the wiring board.

(17) As illustrated in FIG. 9A, on each of the front and back sides of the second support plate 42, laser is irradiated to the interlayer insulating layer 24, and the multiple via holes (24H) penetrating the interlayer insulating layer 44 are formed. These multiple via holes (24H) are formed on a portion on an outer side of the annular pattern 52 of the first conductor layer (13A), which is formed on the first surface (11F) of the first laminated wiring portion 11. Further, the via holes (24H) each have a tapered shape that is gradually reduced in diameter toward the second support plate 42 side.

(18) An electroless plating treatment is performed, and an electroless plating film (not illustrated in the drawings) is formed on the copper foil 37 laminated on each of the interlayer insulating layers 24 and on inner surfaces of the via holes (14H).

Figure 9B:
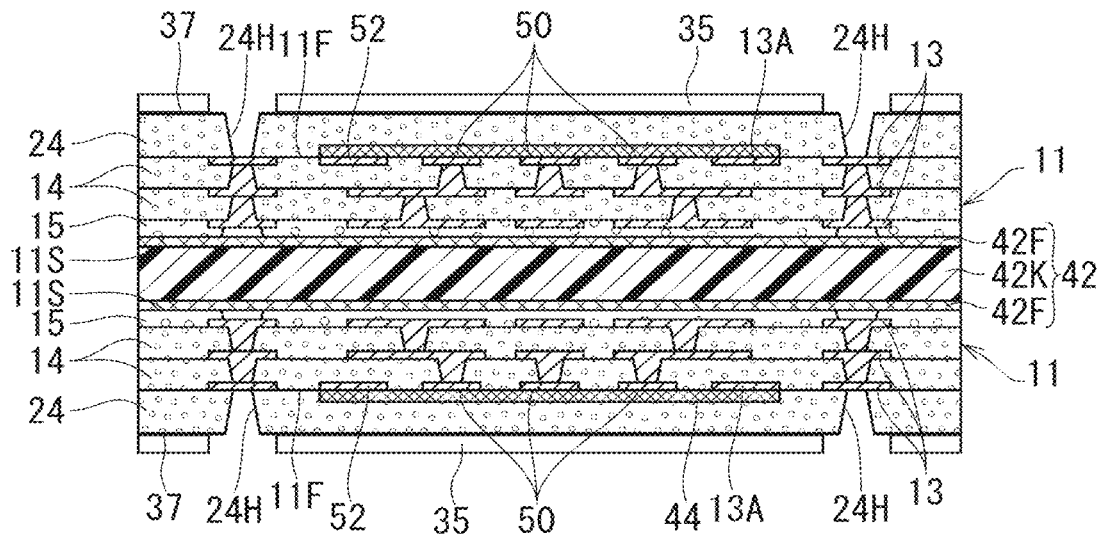

(19) As illustrated in FIG. 9B, a plating resist 35 of a predetermined pattern is formed on the electroless plating film on the copper foil 37 laminated on each of the interlayer insulating layers 24. The plating resist 35 is formed so as to cover an entire portion of the interlayer insulating layer 24 formed directly on the release film 44 such that a conductor layer 23 is not formed directly on the release film 44 in the following process (20).

Figure 10A:
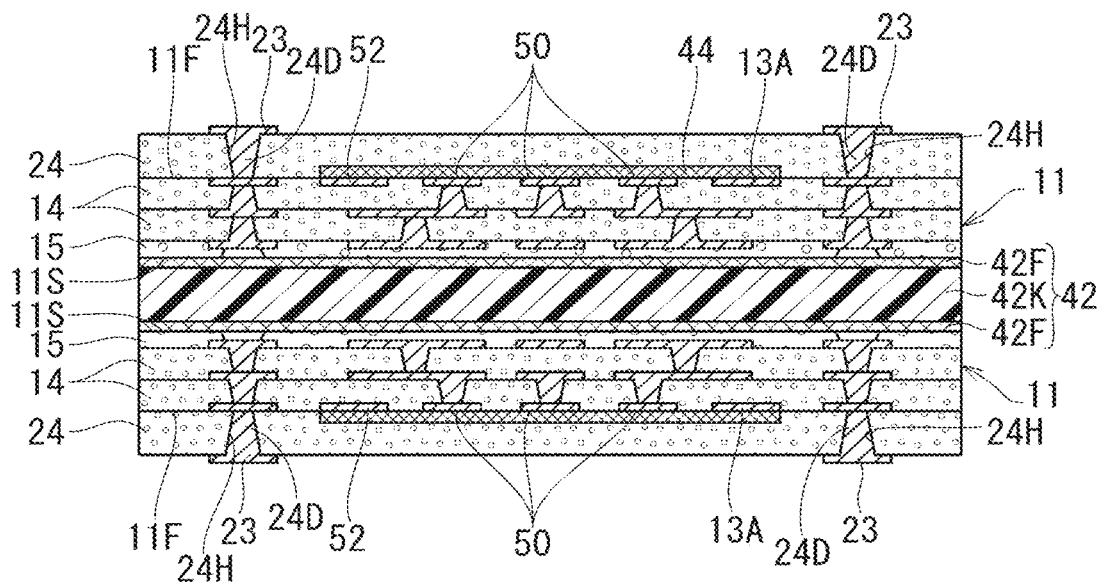
FIGS. 10A and 10B are cross-sectional side views illustrating manufacturing processes of the wiring board.

(20) An electrolytic plating treatment is performed. The via holes (24H) are filled with electrolytic plating and the second via conductors (24D) are formed (see FIG. 10A). Further, an electrolytic plating film is formed on portions of the electroless plating film exposed from the plating resist 35 on each of both front and back sides of the second support plate 42. Next, the plating resist 35 is peeled off, and the electroless plating film and the copper foil 37 below the plating resist 35 are removed. Then, as illustrated in FIG. 10A, a conductor layer 23 is formed by the remaining electrolytic plating film, electroless plating film and copper foil 37 on the interlayer insulating layer 24.

Figure 10B:
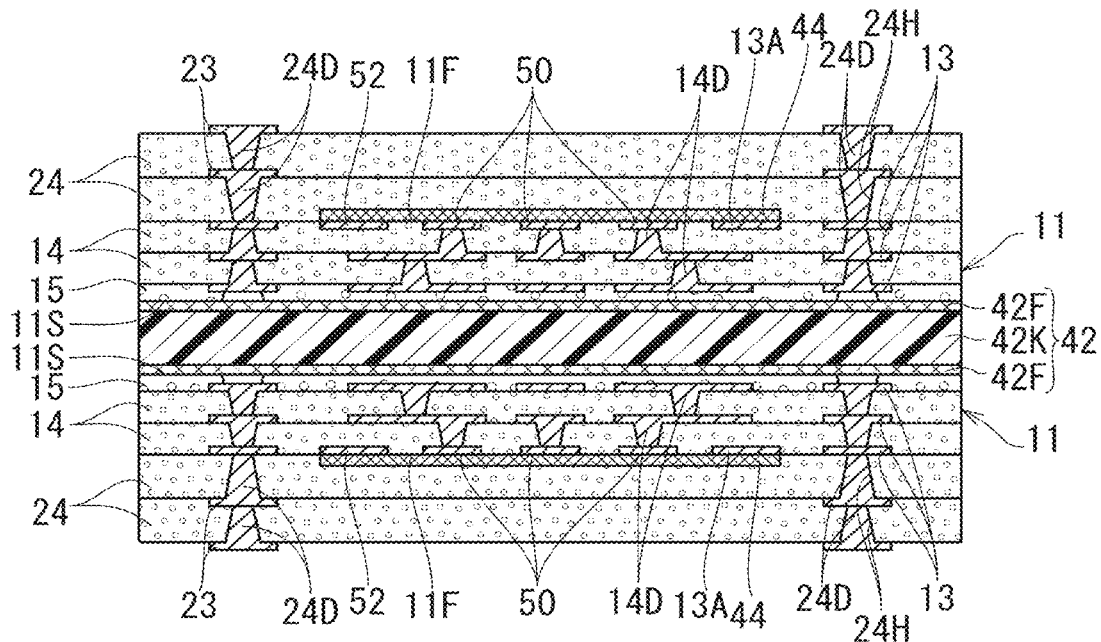

(21) By performing the same processes as the above-described processes (16)-(20), as illustrated in FIG. 10B, on each of the conductor layers 23 on the front and back sides of the second support plate 42, an interlayer insulating layer 24 and a conductor layer 23 are laminated, and, in the laminated interlayer insulating layer 24, second via conductors (24D) are formed connecting the conductor layers (23, 23) sandwiching the interlayer insulating layer 24.

Figure 11A:
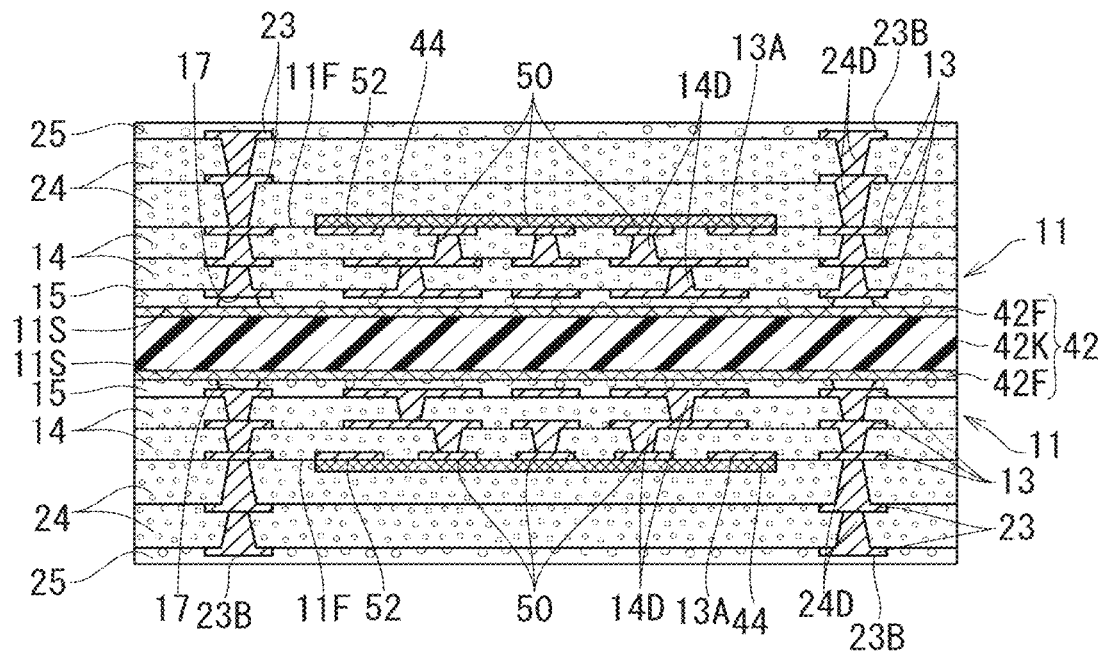
FIGS. 11A and 11B are cross-sectional side views illustrating manufacturing processes of the wiring board.
Figure 11B:
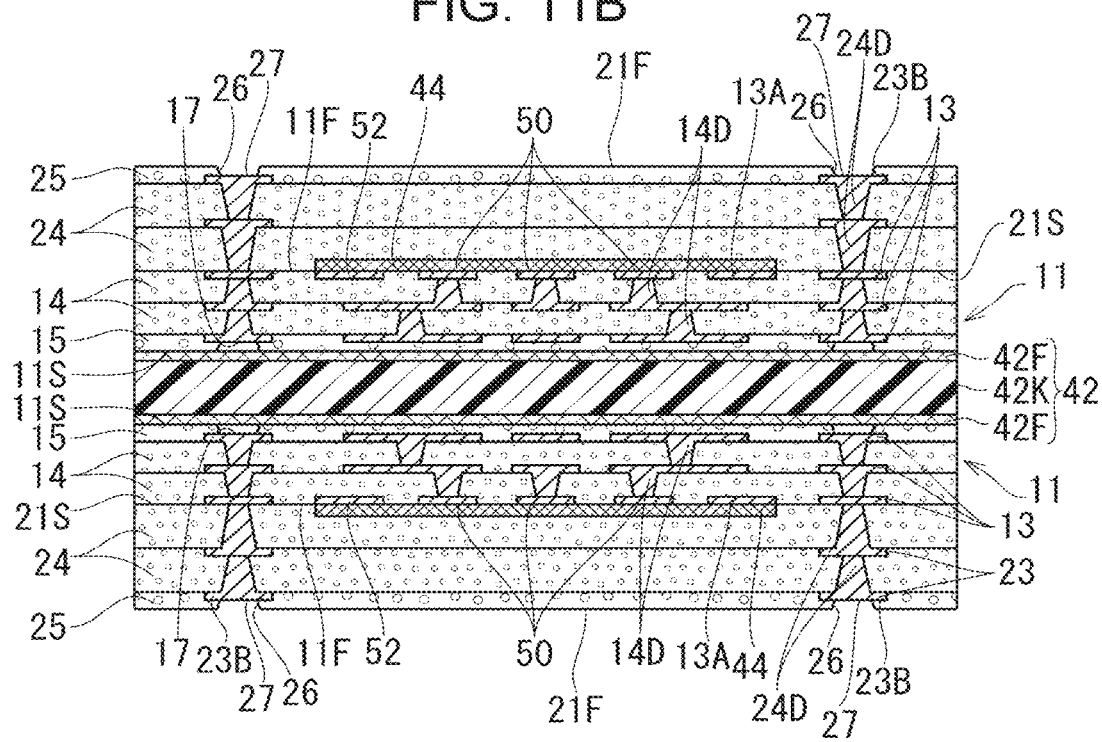

(22) As illustrated in FIG. 11A, a solder resist layer 25 is formed on each of the outermost conductor layers (23B, 23B), which are the conductor layers (23, 23) farthest from the second support plate 42. Next, as illustrated in FIG. 11B, the openings 26 are formed at predetermined places in the solder resist layer 25 by, for example, laser processing or photoresist processing or the like. Then, of the conductor layer 23, portions exposed from the solder resist layer 25 by the openings 26 respectively form the pads 27. In this case, a second laminated wiring portion 21 is formed from the conductor layers 23, the interlayer insulating layers 24 and the solder resist layer 25 laminated on each of the first laminated wiring portions 11 on the front and back sides of the second support plate 42. Further, in this case, of each of the second laminated wiring portions 21, a surface facing the second support plate 42 side is the third surface (21S), and a surface on an opposite side of the third surface (21S) is the fourth surface (21F).

Figure 12A:
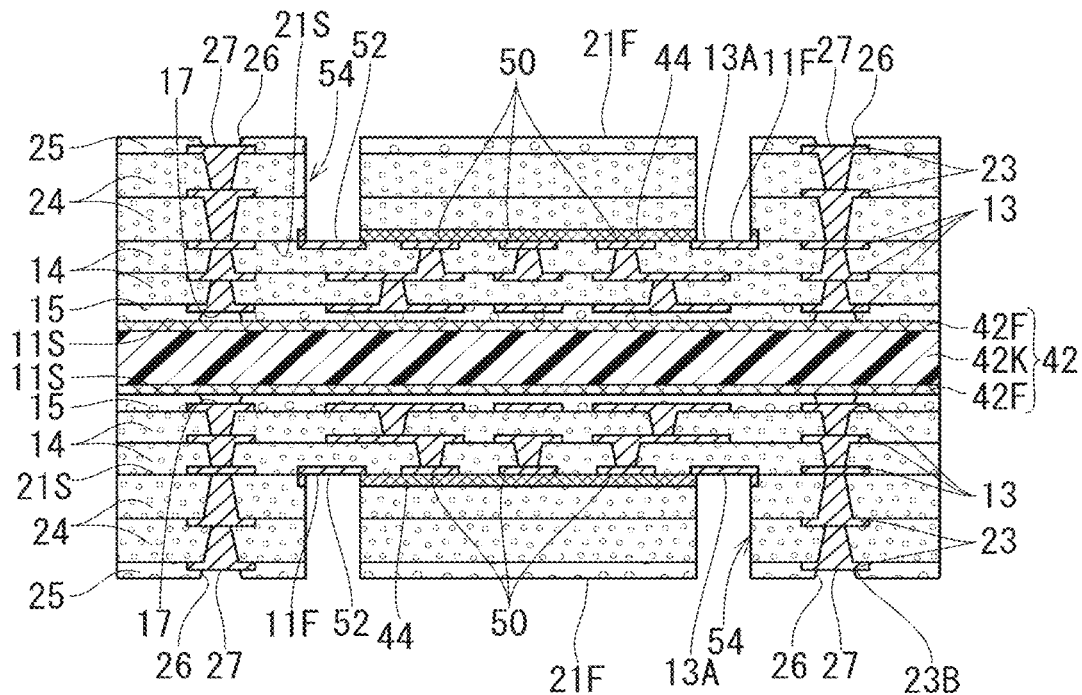
FIGS. 12A and 12B are cross-sectional side views illustrating manufacturing processes of the wiring board.

(23) As illustrated in FIG. 12A, on each of the front and back sides of the second support plate 42, by irradiating laser along the annular pattern 52 from above the solder resist layer 25, an annular recess 54 exposing the annular pattern 52 is formed. Since variation in laser irradiation can occur, in the present embodiment, in order to reliably irradiate laser onto the annular pattern 52, laser is irradiate to a portion between an outer peripheral portion and inner peripheral portion of the annular pattern 52 to avoid the outer peripheral portion and the inner peripheral portion.

Figure 12B:
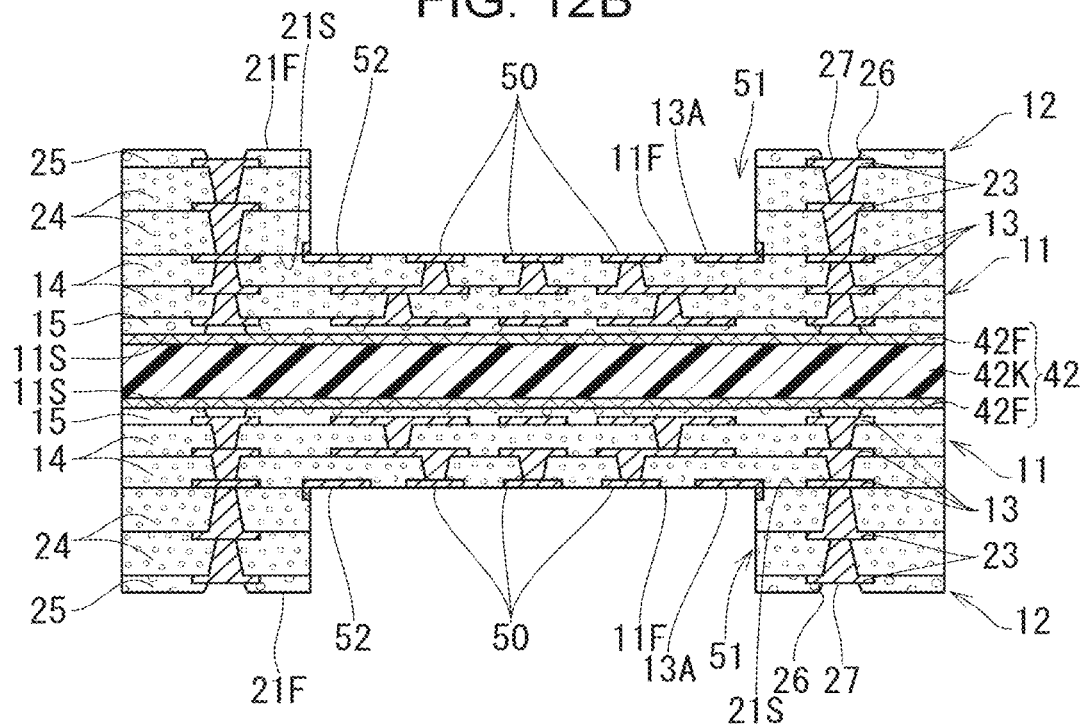

(24) As illustrated in FIG. 12B, of the conductor layers 23, the interlayer insulating layers 24, the solder resist layer 25 and the release film 44, portions formed inside the annular recess 54 are removed, and the cavity portion 51 penetrating the second laminated wiring portion 21 is formed. Then, of the first surface (11F) of the first laminated wiring portion 11, a portion formed inside the annular recess 54 is exposed, and the pads 50 are exposed. In the present embodiment, since the release film 44 is slightly larger than the outer shape of the annular pattern 52, an outer edge portion of the release film 44 is not removed and remains between the first laminated wiring portion 11 and the second laminated wiring portion 21.

(25) The pads 50 are subjected to a surface treatment such as formation of an organic protective film (OSP).

Figure 13:
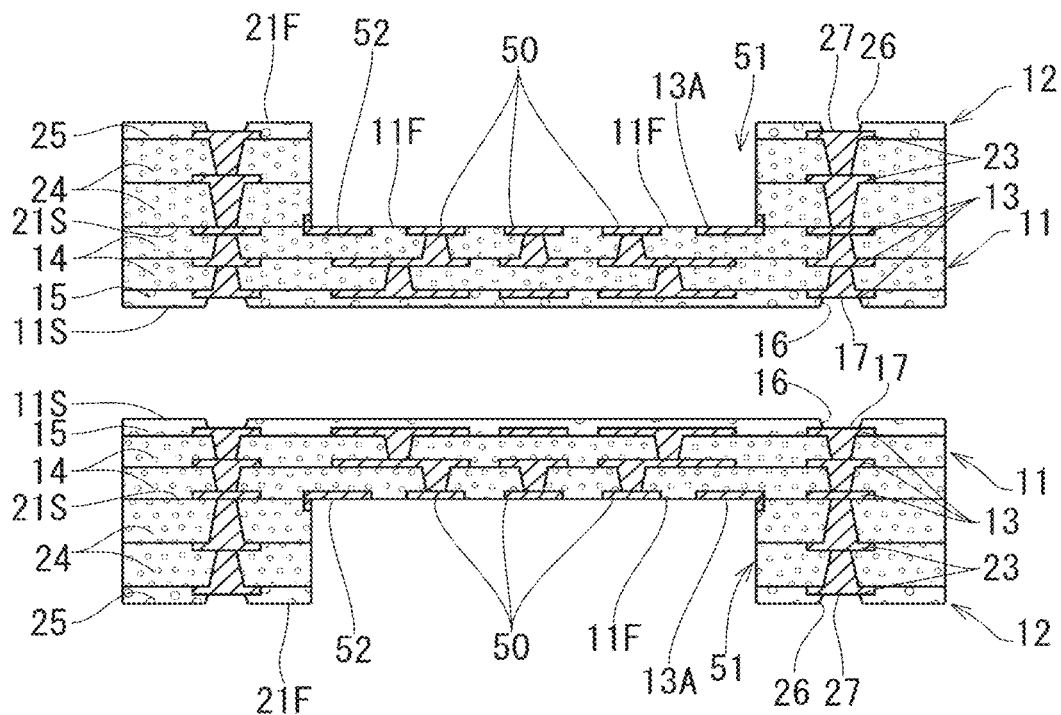
FIG. 13 is a cross-sectional side view illustrating a manufacturing process of the wiring board.

(26) As illustrated in FIG. 13, the first laminated wiring portion 11 and the second laminated wiring portion 21 are peeled off from the second support plate 42.

(27) The solder bumps 28 are respectively formed on the pads 27 formed on the fourth surface (21F) of the second laminated wiring portion 21 (see FIG. 1). As a result, the printed wiring board 10 is completed.

The description about the structure and the manufacturing method of the wiring board 10 of the present embodiment is as given above. Next, an operation effect of the method for manufacturing the wiring board 10 is described. In the method for manufacturing the wiring board 10 of the present embodiment, on the first laminated wiring portion 11 supported on the second support plate 42, the second laminated wiring portion 21 is formed by laminating the conductor layers 23 and the insulating layers (the interlayer insulating layers 24 and the solder resist layer 25), and the formation of the cavity portion 51 in the second laminated wiring portion 21 is performed in the state in which the second laminated wiring portion 21 is supported on the second support plate 42. Therefore, the thin second laminated wiring portion 21, that is, the wiring board 10 having the thin cavity portion 51 can be stably manufactured.

Further, in the method for manufacturing the wiring board 10 of the present embodiment, after the first laminated wiring portion 11 is formed on the first support plate 41, the first laminated wiring portion 11 is turned upside down and is laminated on the second support plate 42. Then, in this state, the second laminated wiring portion 21 is formed on the first laminated wiring portion 11. Therefore, the solder resist layers (15, 25) can be easily respectively formed on both front and back sides of the wiring board 10.

In the method for manufacturing the wiring board 10 of the present embodiment, the release film 44 is laid to cover the entire portion including the annular pattern 52 and the portion inside the annular pattern 52 on the first surface (11F) of the first laminated wiring portion 11. Therefore, by simply forming the annular recess 54, which exposes the annular pattern 52 on the first surface (11F), in the second laminated wiring portion 21, the portion inside the annular recess 54 can be easily removed. Further, in the method for manufacturing the wiring board 10 of the present embodiment, the release film 44 is laid so as to cover the entire annular pattern 52. Therefore, an acceptable range for deviation in laser irradiation for forming the annular recess 54 is widened and laser processing can be easily performed.

In the method for manufacturing the wiring board 10 of the present embodiment, the first laminated wiring portion 11 is formed on the copper foil 43 on the first support plate 41. Therefore, by simply removing the copper foil 43 using an etching solution, the first surface can be formed flat. As a result, the electronic component 100 that is accommodated in the cavity portion 51 and is connected to the pads 50 can be stably placed.

Further, in the method for manufacturing the wiring board 10 of the present embodiment, a wiring board 10 is formed on each of both front and back sides of the first support plate 41 and the second support plate 42. Therefore, two wiring boards (10, 10) can be formed at once.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

(1) In the above embodiment, the formation of the wiring board 10 is performed on both front and back sides of the first support plate 41 and the second support plate 42. However, it is also possible that the formation of the wiring board 10 is performed on only one of the two sides of the support plates (41, 42).

(2) In the above embodiment, the release film 44 is slightly larger than the outer shape of the annular pattern 52. However, it is also possible that the release film 44 has substantially the same size as the outer shape of the annular pattern 52. Further, as long as an outer edge portion of the release film 44 is formed on the annular pattern 52 over an entire outer circumference of the release film 44, it is also possible that the release film 44 has a smaller size than the outer shape of the annular pattern 52. In this case, the cavity portion 51 can be formed by performing laser processing along the annular pattern 52 such that a portion of the annular pattern 52 on which the outer edge portion of the release film 44 is laid is exposed.

In a method for manufacturing a wiring board, a first laminated wiring portion, which is obtained by laminating a conductor layer and an insulating layer, and a second laminated wiring portion, which is obtained by laminating a conductor layer and an insulating layer and in which a cavity portion is formed penetrating therethrough in a thickness direction, may be prepared, and the second laminated wiring portion is laminated and bonded onto the first laminated wiring portion (for example, see Japanese Patent Laid-Open Publication No. 2015-60912).

In the above-described method for manufacturing the wiring board, when the second laminated wiring portion is thinned in order to thin the cavity portion, strength of the second laminated wiring portion is reduced and thus, there is a problem that it may be difficult to stably manufacture the wiring board.

A method for manufacturing a wiring board according to an embodiment of the present invention allows a wiring board having a thin cavity portion to be stably manufactured.

A method for manufacturing a wiring board according to an embodiment of the present invention includes: forming a first laminated wiring portion by alternately laminating multiple conductor layers and multiple insulating layers on a first support plate, the first laminated wiring portion having a first surface on the first support plate side and a second surface on an opposite side of the first surface; peeling off the first laminated wiring portion from the first support plate; forming pads on a conductor layer exposed on the first surface; laminating the first laminated wiring portion on a second support plate such that the second surface faces the second support plate side; forming a second laminated wiring portion on the second support plate by alternately laminating conductor layers and insulating layers on the first surface of the first laminated wiring portion, the second laminated wiring portion having a third surface on the second support plate side and a fourth surface on an opposite side of the third surface; forming a cavity portion exposing the pads in the second laminated wiring portion on the second support plate; and peeling off the first laminated wiring portion and the second laminated wiring portion from the second support plate.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a wiring board, comprising:
   forming on a first support plate a first laminated wiring portion comprising a plurality of conductor layers and a plurality of insulating layers such that the first laminated wiring portion has a first surface on a first support plate side and a second surface on an opposite side with respect to the first surface;
   separating the first laminated wiring portion from the first support plate;
   forming a conductor layer exposed on the first surface of the first laminated wiring portion and comprising a plurality of pads;
   laminating the first laminated wiring portion on a second support plate such that the second surface of the first laminated wiring portion faces a second support plate side;
   forming on the first surface of the first laminated wiring portion a second laminated wiring portion comprising a plurality of conductor layers and a plurality of insulating layers such that the second laminated wiring portion has a third surface on the first surface of the first laminated wiring portion and a fourth surface on an opposite side with respect to the third surface;
   forming a cavity portion in the second laminated wiring portion on the second support plate such that the cavity portion exposes the plurality of pads; and
   separating the first laminated wiring portion and the second laminated wiring portion from the second support plate.

2. A method for manufacturing a wiring board according to claim 1, wherein the forming of the conductor layer comprises forming the conductor layer exposed on the first surface of the first laminated wiring portion and comprising an annular pattern, and the forming of the cavity portion comprises applying laser along the annular pattern.

3. A method for manufacturing a wiring board according to claim 2, wherein the forming of the second laminated wiring portion comprises forming a release film entirely covering the plurality of pads.

4. A method for manufacturing a wiring board according to claim 3, wherein the forming of the first laminated wiring portion comprises forming a plurality of first via conductors through the insulating layers in the first laminated wiring portion such that each of the first via conductors has a tapered shape reducing in diameter from a second surface side toward a first surface side and connects the conductor layers in the first laminated wiring portion, and the forming of the second laminated wiring portion comprises forming a plurality of second via conductors through the insulating layers in the second laminated wiring portion such that each of the second via conductors has a tapered shape reducing in diameter from a fourth surface side toward a third surface side and connects the conductor layers in the second laminated wiring portion.

5. A method for manufacturing a wiring board according to claim 4, wherein the forming of the first laminated wiring portion comprises forming a solder resist layer on a conductor layer formed farthest from the first support plate in the first laminated wiring portion.

6. A method for manufacturing a wiring board according to claim 3, wherein the forming of the first laminated wiring portion comprises forming a solder resist layer on a conductor layer formed farthest from the first support plate in the first laminated wiring portion.

7. A method for manufacturing a wiring board according to claim 3, wherein the forming of the second laminated wiring portion comprises forming a solder resist layer on a conductor layer formed farthest from the second support plate in the second laminated wiring portion.

8. A method for manufacturing a wiring board according to claim 2, wherein the forming of the first laminated wiring portion comprises forming a plurality of first via conductors through the insulating layers in the first laminated wiring portion such that each of the first via conductors has a tapered shape reducing in diameter from a second surface side toward a first surface side and connects the conductor layers in the first laminated wiring portion, and the forming of the second laminated wiring portion comprises forming a plurality of second via conductors through the insulating layers in the second laminated wiring portion such that each of the second via conductors has a tapered shape reducing in diameter from a fourth surface side toward a third surface side and connects the conductor layers in the second laminated wiring portion.

9. A method for manufacturing a wiring board according to claim 2, wherein the forming of the first laminated wiring portion comprises forming a solder resist layer on a conductor layer formed farthest from the first support plate in the first laminated wiring portion.

10. A method for manufacturing a wiring board according to claim 2, wherein the forming of the second laminated wiring portion comprises forming a solder resist layer on a conductor layer formed farthest from the second support plate in the second laminated wiring portion.

11. A method for manufacturing a wiring board according to claim 1, wherein the forming of the second laminated wiring portion comprises forming a release film entirely covering the plurality of pads.

12. A method for manufacturing a wiring board according to claim 11, wherein the forming of the first laminated wiring portion comprises forming a plurality of first via conductors through the insulating layers in the first laminated wiring portion such that each of the first via conductors has a tapered shape reducing in diameter from a second surface side toward a first surface side and connects the conductor layers in the first laminated wiring portion, and the forming of the second laminated wiring portion comprises forming a plurality of second via conductors through the insulating layers in the second laminated wiring portion such that each of the second via conductors has a tapered shape reducing in diameter from a fourth surface side toward a third surface side and connects the conductor layers in the second laminated wiring portion.

13. A method for manufacturing a wiring board according to claim 11, wherein the forming of the first laminated wiring portion comprises forming a solder resist layer on a conductor layer formed farthest from the first support plate in the first laminated wiring portion.

14. A method for manufacturing a wiring board according to claim 11, wherein the forming of the second laminated wiring portion comprises forming a solder resist layer on a conductor layer formed farthest from the second support plate in the second laminated wiring portion.

15. A method for manufacturing a wiring board according to claim 1, wherein the forming of the first laminated wiring portion comprises forming a plurality of first via conductors through the insulating layers in the first laminated wiring portion such that each of the first via conductors has a tapered shape reducing in diameter from a second surface side toward a first surface side and connects the conductor layers in the first laminated wiring portion, and the forming of the second laminated wiring portion comprises forming a plurality of second via conductors through the insulating layers in the second laminated wiring portion such that each of the second via conductors has a tapered shape reducing in diameter from a fourth surface side toward a third surface side and connects the conductor layers in the second laminated wiring portion.

16. A method for manufacturing a wiring board according to claim 15, wherein the forming of the first laminated wiring portion comprises forming a solder resist layer on a conductor layer formed farthest from the first support plate in the first laminated wiring portion.

17. A method for manufacturing a wiring board according to claim 15, wherein the forming of the second laminated wiring portion comprises forming a solder resist layer on a conductor layer formed farthest from the second support plate in the second laminated wiring portion.

18. A method for manufacturing a wiring board according to claim 1, wherein the forming of the first laminated wiring portion comprises forming a solder resist layer on a conductor layer formed farthest from the first support plate in the first laminated wiring portion.

19. A method for manufacturing a wiring board according to claim 18, wherein the forming of the second laminated wiring portion comprises forming a solder resist layer on a conductor layer formed farthest from the second support plate in the second laminated wiring portion.

20. A method for manufacturing a wiring board according to claim 1, wherein the forming of the second laminated wiring portion comprises forming a solder resist layer on a conductor layer formed farthest from the second support plate in the second laminated wiring portion.

* * * * *